United States Patent
Tsunai

(10) Patent No.: US 8,102,443 B2
(45) Date of Patent: Jan. 24, 2012

(54) CCD IMAGE SENSOR HAVING CHARGE STORAGE SECTION BETWEEN PHOTODIODE SECTION AND CHARGE TRANSFER SECTION

(75) Inventor: Shiro Tsunai, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 773 days.

(21) Appl. No.: 12/025,062

(22) Filed: Feb. 4, 2008

(65) Prior Publication Data
US 2008/0225152 A1    Sep. 18, 2008

(30) Foreign Application Priority Data

Mar. 13, 2007  (JP) ................................. 2007-062801
Dec. 13, 2007  (JP) ................................. 2007-322098

(51) Int. Cl.
H04N 9/64      (2006.01)
H04N 5/335    (2006.01)
H01L 27/00    (2006.01)

(52) U.S. Cl. ....................... 348/243; 348/311; 250/208.1

(58) Field of Classification Search .................. 348/297, 348/294, 243, 319; 257/700; 250/208.1; 438/283, 257–259
See application file for complete search history.

(56) References Cited

U.S. PATENT DOCUMENTS

| | | | |
|---|---|---|---|
| 7,271,835 B2 * | 9/2007 | Iizuka et al. | 348/314 |
| 7,399,951 B2 * | 7/2008 | Morimoto et al. | 250/208.1 |
| 7,427,736 B2 * | 9/2008 | Xu et al. | 250/208.1 |
| 2006/0044437 A1 * | 3/2006 | Shah | 348/308 |

FOREIGN PATENT DOCUMENTS

| | | |
|---|---|---|
| JP | 6-216363 | 8/1994 |
| JP | 2937192 | 8/1999 |
| JP | 2000-2499907 | 9/2000 |
| JP | 2004-112797 | 4/2004 |

* cited by examiner

*Primary Examiner* — Trung Diep
(74) *Attorney, Agent, or Firm* — Young & Thompson

(57) ABSTRACT

The signal charge corresponding to the amount of light is obtained from a photodiode section and is then stored in a charge storage section under the control of a first control gate. An additional charge storage section may be provided between the photodiode section and the charge storage section. The signal charge thus stored in the charge storage section is supplied to a charge transfer section under the control of a second control gate. The charge storage section is set to operate in a PIN-ing state during its operation, which may be carried out by, for example, covering an N-type region with a storage control electrode to which a predetermined DC bias voltage is applied, or by forming a P-type region in surface portion of the N-type region.

6 Claims, 19 Drawing Sheets

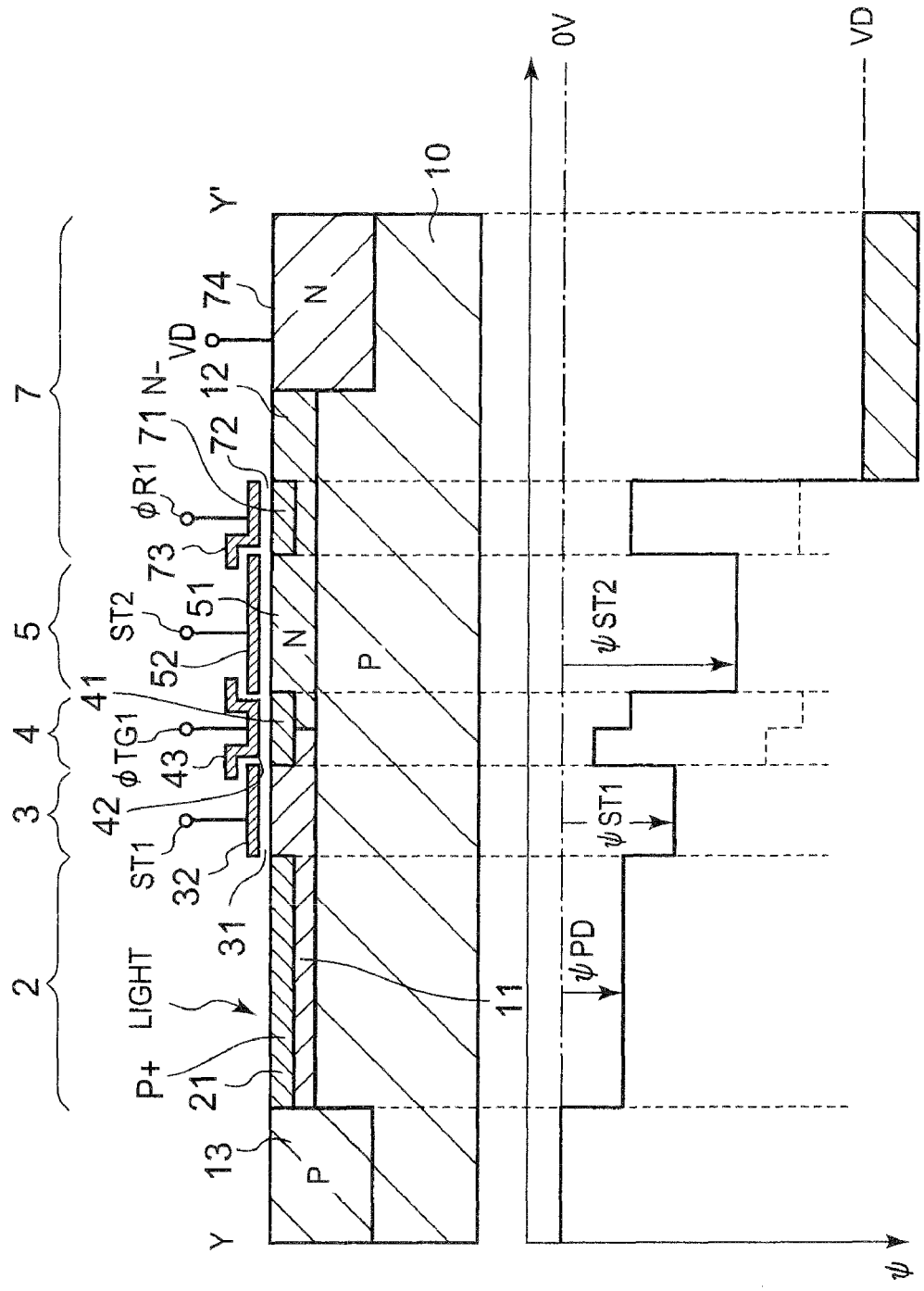

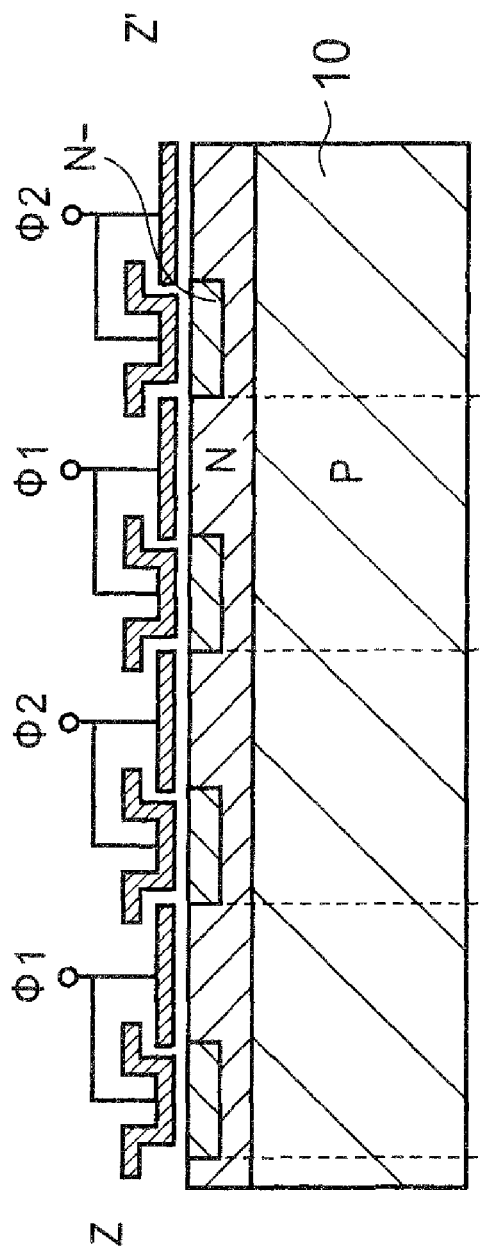
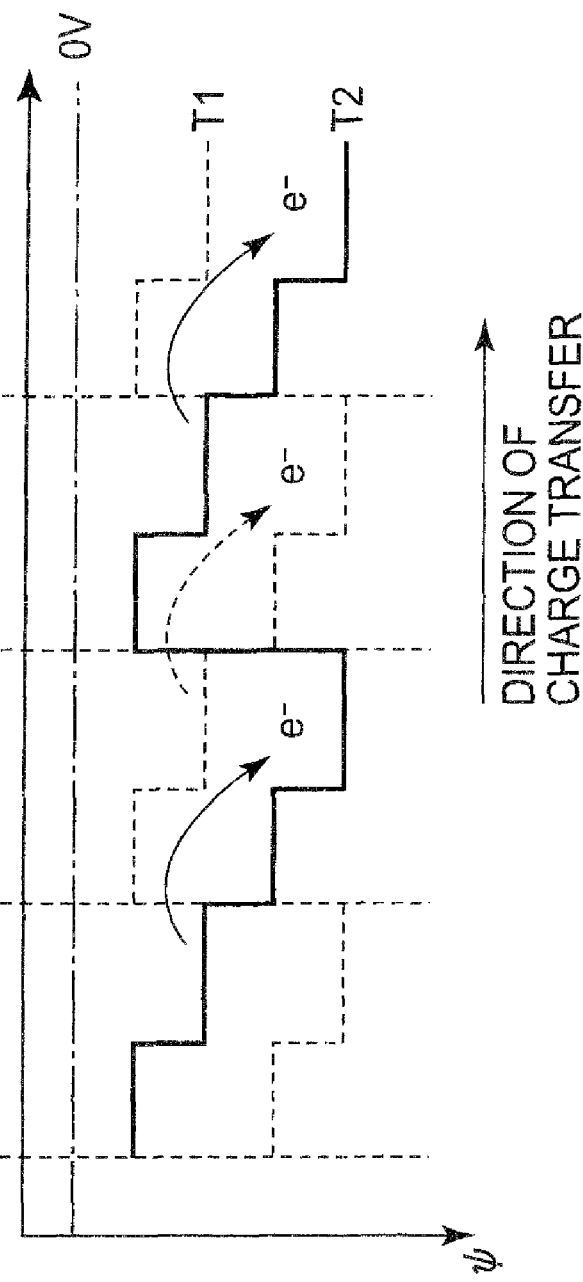
Fig. 4A
Fig. 4B

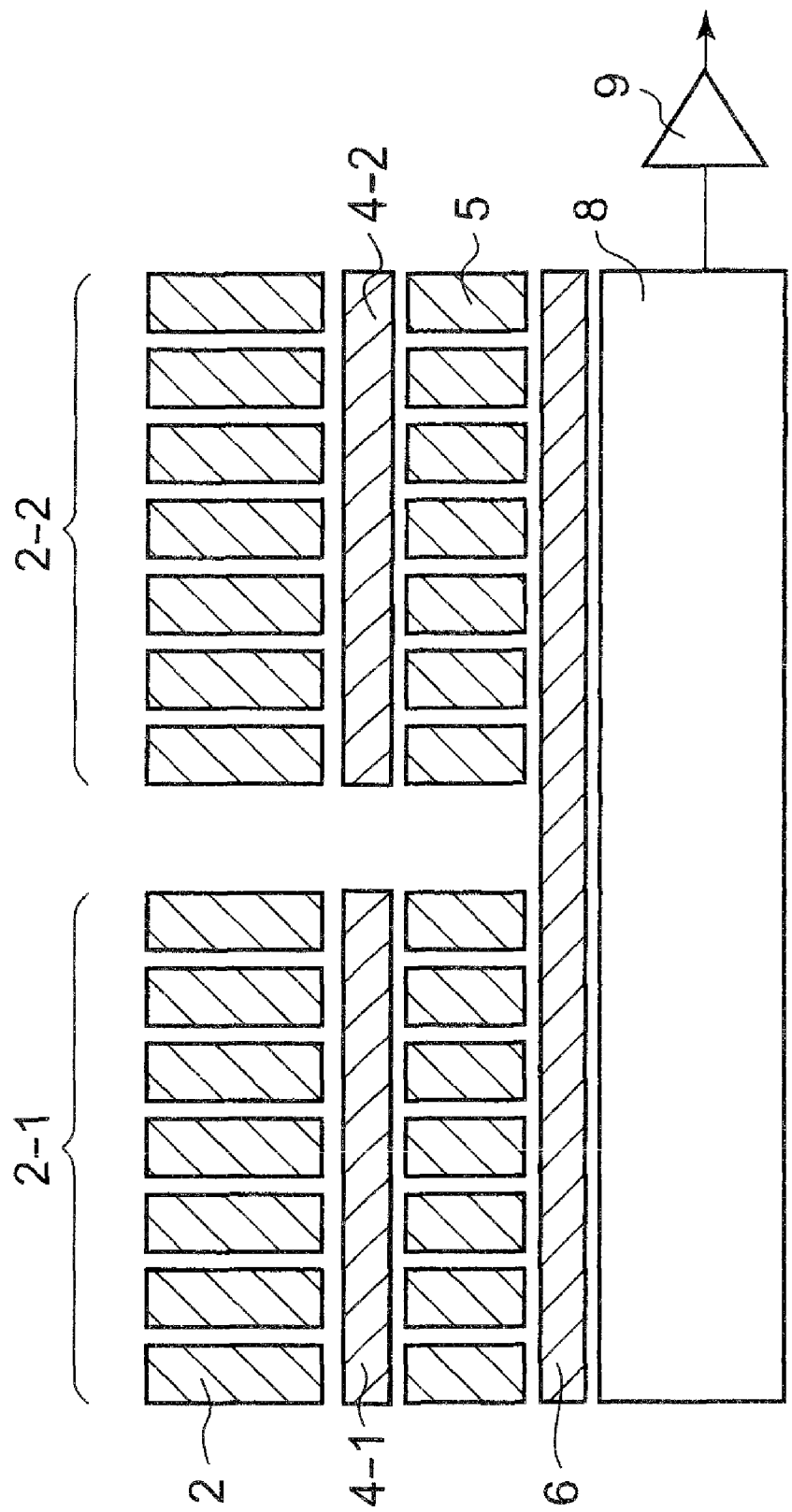

CCD IMAGE SENSOR HAVING CHARGE STORAGE SECTION BETWEEN PHOTODIODE SECTION AND CHARGE TRANSFER SECTION

BACKGROUND OF THE INVENTION

1. Field of the Invention

The present invention relates to a CCD image sensor. More particularly, the present invention relates to a CCD image sensor having a charge storage section between a photodiode section and a charge transfer section, the charge storage section being used to store electric charges (called hereinafter "charges") obtained through photoelectric conversion by the photodiode section.

2. Description of Related Art

Of such CCD image sensors, Japanese Patent No. 2937192 discloses such a CCD image sensor that has a photodiode for photoelectrically converting the received light and a storage section for controlling storage of charges obtained through photoelectric conversion. In this conventional CCD image sensor, the surface of each of a silicon substrate of the photodiode and the storage section is N-type in the active state.

Furthermore, a barrier gate is provided between the photodiode and the storage section. The barrier gate receives a constant positive voltage, and is not used to control storage of signal charges generated in the photodiode. Moreover, a constant positive voltage is applied to the storage section, and the storage section including even the surface of the substrate is N-type in the active state.

FIG. 16 shows an example of a CCD image sensor according to another prior art, where a single CCD 8 is provided with multiple image areas 2-1 and 2-2 each including multiple photodiodes 2. Different image signals are inputted into the image areas 2-1 and 2-2, and signal charges are generated in the image areas 2-1 and 2-2, respectively. Control gates 4-1 and 4-2 each independently control a storage time, and the generated signal charges are stored in storage sections 5.

Japanese Patent Application Laid-open Publication No. Hei 6-216363 discloses a CCD image sensor capable of reducing a dark current. FIG. 17 is a view showing a configuration of the CCD image sensor described in this Patent document. A CCD image sensor 1 has a structure to store charges generated at photodiodes 2 in storage gates 5. In this structure, a potential barrier or the like, which blocks charge transfer from the photodiodes 2 to the CCD 8, is not generated. In addition, negative voltages are applied to the storage gates 5.

Here, descriptions will be given of the operation of the CCD image sensor 1 shown in FIG. 17, with reference to FIGS. 18A, 18B and 19. FIG. 18A is a cross-sectional view of the CCD image sensor, taken along the line X-X' in FIG. 17. FIG. 18B shows a potential of each part in FIG. 18A. Furthermore, FIG. 19 is a view showing a potential profile of each part (the photodiode section, the storage section, and a transfer gate section) of the CCD image sensor in a depth direction. All the charges generated in the photodiode 2 are stored in the storage gate 5. As shown in FIG. 19, a negative voltage is applied to the storage gate 5 so as to invert the substrate surface to P-type. In the storage gate 5 in the PIN-ing state, a part of the semiconductor in contact with the gate oxide film is inverted to P-type, and the surface potential is a GND potential.

Moreover, there is another CCD image sensor described in Japanese Patent Application Laid-open Publication No. 2004-112797 as an application example of a structure including a charge storage section. This corrects spatial line differences of multiple photoreceptors, by providing an analog memory between the photoreceptor and a shift register as a charge transfer section.

There is a device for optically measuring a distance to a measurement target as another application example of the structure including a charge storage section, as shown in Japanese Patent Application Laid-open Publication No. 2000-249907. This is particularly used as a sensor for an auto focus (AF) function of a digital camera.

SUMMARY

A CCD image sensor according to an embodiment of the present invention includes a photodiode section; a charge storage section, a charge transfer section, a first control gate section which is provided between the photodiode section and the charge storage section to control the movement of a signal charge from the photodiode section to the charge storage section, and a second control gate section which is provided between the charge storage section and the charge transfer section to control the movement of a charge from the charge storage section to the charge transfer section. In the CCD image sensor, further, the charge storage section is configured to hold the charge in the PIN-ing state.

Here, in order to configure that the charge storage section holds charges in the PIN-ing state, it is preferable that a first conductivity type region (generally, an N-type region) as the charge storage section should be covered with an electrode to which a predetermined DC bias voltage is applied, or that a second conductive type region (accordingly, a P-type region) should be formed at the surface portion of the first conductivity region. The latter structure is adopted to the photodiode section as the so-called "PIN diode".

Note that an auxiliary or additional charge storage section may be provided continuously with the photodiode region. In this case, it is preferable that the additional charge storage section should be covered with an electrode supplied with a predetermined DC bias voltage, which is then brought into the PIN-ing state.

With the above-described constituent, a period of time for photoelectric conversion and that for charge storage are both controllable with first and second control gates. This enables the charge storage section to hold charges corresponding to a necessary amount of light for any desired time period, in order to take images in a very wide range of light amount from a night view to a view under sunlight. Moreover, the existence of the first and second control gates allows the charge storage region to be in the PIN-ing state under conditions free from any influence from the photodiode section and the charge transfer section, and prevents the generation of a dark current. Thus, there is provided is a CCD image sensor capable of preventing the generation of the dark current and transferring signal charges without producing an afterimage.

BRIEF DESCRIPTION OF THE DRAWINGS

The objects, advantages and features of the present invention will be more apparent from the following description of certain preferred embodiments taken in conjunction with the accompanying drawings, in which:

FIG. 3A is a cross-sectional view taken along the line Y-Y' of FIG. 1, and FIG. 3B is a potential view during operation;

FIG. 4A is a cross-sectional view taken along the line Z-Z' of FIG. 1, and FIG. 4B is a potential view during operation;

FIG. 16 is a plan view showing a conventional image sensor;

DETAILED DESCRIPTION OF THE PREFERRED EMBODIMENTS

Figure 1:
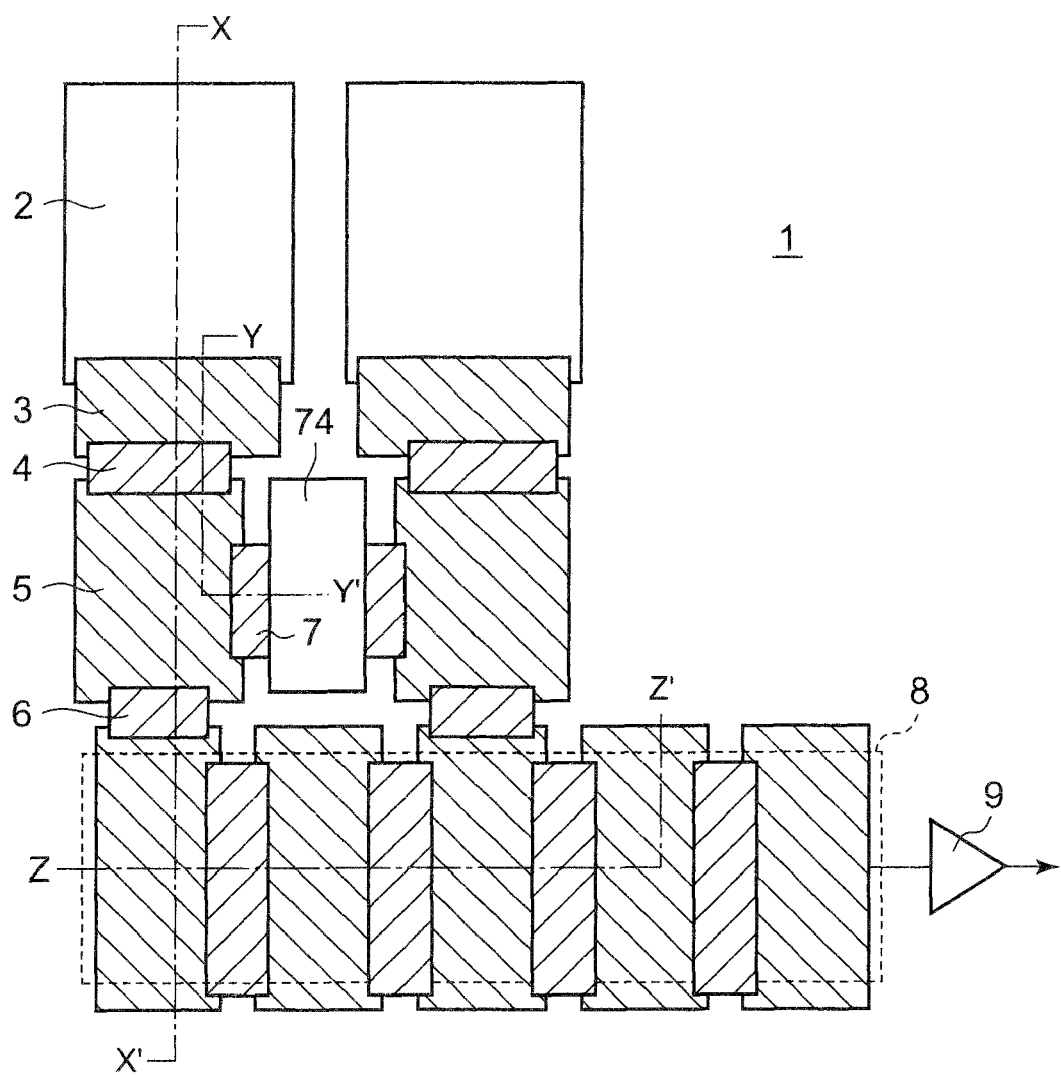
FIG. 1 is a plan view showing a CCD image sensor according to a first embodiment of the present invention.

Detailed descriptions will hereinafter be given on embodiments of the present invention, with reference to drawings. However, a CCD image sensor having a charge storage section is applied to various application fields, similarly to the present invention. Particularly in an image sensor for auto focus, a storage time (or period of time for exposure) needs to be widely changed because the focus needs to be adjusted for focusing in accordance with extremely wide variations in light amount from a night view to under sunlight. Furthermore, as it gets dark, a signal amount from a subject decreases. Therefore, it is necessary to reduce dark current generated in a photodiode and a storage section, that is, a noise component generated by the sensor itself.

The preferred embodiments of the present invention satisfy these two requirements at the same time.

Note that, in a CCD image sensor, a part excluding a light receiving plane of a photodiode serving as a photodiode section is generally covered with a light shielding film made of metal in order to prevent light from entering. However, the illustrations of the light shielding film are omitted for the purpose of simplification in some of the following descriptions and drawings. In addition, descriptions will be omitted of those which are the same as a conventional structure such as configurations of a surface protection oxide film and an output circuit. Moreover, a CCD image sensor according to each embodiment of the present invention may have a storage control function which uses an auto gain control (AGC) function for automatically making adjustments so that an output signal does not exceed a reference level, and the like. Furthermore, in each embodiment, the same reference numerals are given to the same constituents, and redundant descriptions thereof will be omitted.

Figures 2A, 2B:
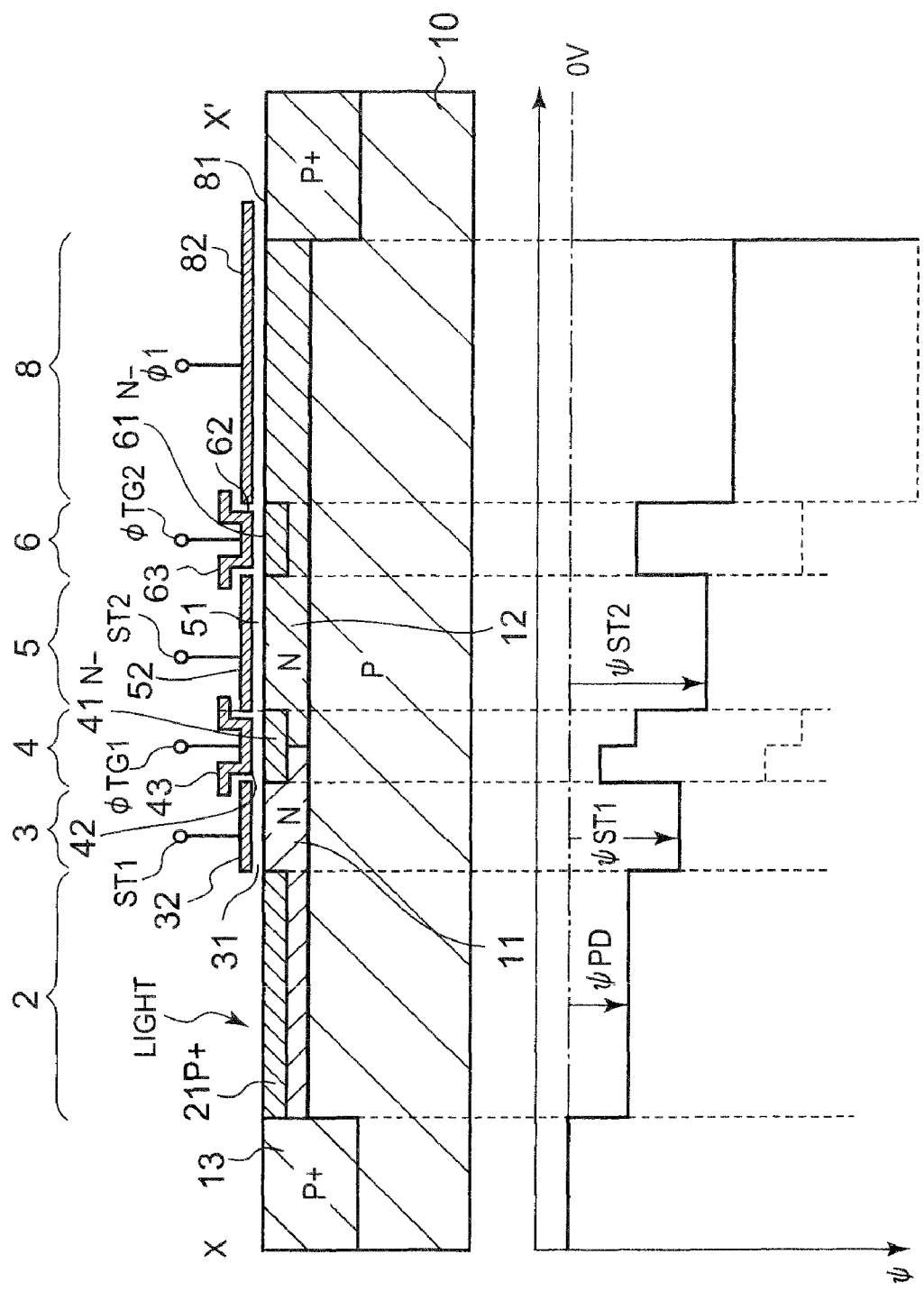
FIG. 2A is a cross-sectional view taken along the line X-X' of FIG. 1.
FIG. 2B is a potential view during operation.

FIG. 1 is a schematic plan view for explaining a configuration of a CCD image sensor according to a first embodiment of the present invention. Additionally, FIG. 2A is a cross-sectional view taken along the line X-X' of FIG. 1, and FIG. 2B is a potential view during operation. FIG. 3A is a cross-sectional view taken along the line Y-Y' of FIG. 1, and FIG. 3B is a potential view during operation. FIG. 4A is a cross-sectional view taken along the line Z-Z' of FIG. 1, and FIG. 4B is a potential view during operation.

As shown in FIG. 1, a CCD image sensor 1 according to this embodiment includes a photodiode section 2, an auxiliary charge storage section 3 formed continuously with the photodiode section 2, a charge storage section 5, a first control gate section 4 provided between these storage sections 3 and 5, a charge transfer section 8, a second control gate section 6 provided between the charge storage section 5 and the charge transfer section 8, a reset section 7 for resetting the charge storage section 5, and an output amplifier 9 for amplifying and outputting charges from the charge transfer section 8.

With reference to FIG. 2A which is a cross-sectional view taken along the line X-X' of FIG. 1, a first N-type region 11 and a second N-type region 12 (a relation of their respective impurity densities will be described later) are selectively formed on the surface part of a P-type semiconductor substrate 10 (also referred to as a "semiconductor substrate layer") made of silicon, for example, in this embodiment. The first region 11 and the second region 12 are formed adjacently. A P+-type region 21, which is higher in density than the silicon substrate 10, is selectively formed on the surface part of the N-type first region 11. The photodiode section 2 of a so-called PIN photodiode structure is formed of the P+-type region 21 and the N-type first region 11. The photodiode section 2 generates a signal charge in response to the received light. A P+-type channel stop section 13 prevents the signal charge generated in the photodiode section 2 from flowing in all directions, except the direction of the first storage section 3.

Furthermore, a part opposite to the channel stop section 13 of the first region 11 becomes the auxiliary charge storage section 3, and receives the signal charge generated in the photodiode section 2. In other words, the charge generated by light incident on the photodiode section 2 is temporarily stored in the storage section 3. The storage section 3 has a first storage gate electrode 32 provided above the first region 11 with a first storage gate insulation film 31 interposed therebetween. A steady negative voltage is applied to the first storage gate electrode 32 during operation. Accordingly, an interface between the first region 11 and the first storage gate insulation film 31 is in the PIN-ing state in which the interface is reversed to the P-type. On the other hand, the charge storage section 5 is provided in the second region 12, adjacently to the first storage section 3. The storage section 5 receives a signal charge from the storage section 5. The storage section 5 has a second storage gate electrode 52 provided above the second region 12 with a second storage gate insulation film 51 interposed therebetween. A steady negative voltage is applied to the storage gate electrode 52 during operation. Accordingly, an interface between the second region 12 and the second storage gate insulation film 51 is in the PIN-ing state in which the interface is reversed to the P-type. In other words, the charge storage section 5 also stores the charge in the PIN-ing state. The charge transfer section 8 is formed in the second region 12, adjacently to the storage section 5. The charge transfer section 8 has a gate electrode 82 above the N-type second region 12 with a gate insulation film 81 interposed therebetween. The charge transfer section 8 receives the signal charge from the second storage section 5 at a predetermined timing.

The first control gate section 4 is formed between the storage sections 3 and 5. The control section 4 controls passing the signal charge stored in the auxiliary storage section 3 to the charge storage section 5, and is formed lying astride the surface part of the first region 11 and the surface part of the second region 12. Specifically, the control section 4 lies astride the surface part of the first region 11 and the surface part of the second region 12, and has a gate electrode 43 provided above a first impurity layer 41 which: is the same conductive type as the first region 11 and the second region 12; and is formed with a lower impurity density than the first region 11 and the second region 12, with an insulation film 42 interposed therebetween. A part of the surfaces of the N-type regions 11 and 12 becomes an N-layer with a low density, that is, the first impurity layer 41, by implanting boron so as to reach, for example, $9.0 \times 1011/cm^2$ at 50 KeV.

In addition, a predetermined clock pulse is applied to the first control gate electrode 43 formed above the first impurity layer 41 with the first control gate insulation film 42 interposed therebetween. Accordingly, the passing of the signal charge from the storage section 3 to the storage section 5 is controlled. A part of the gate electrode 43 overlaps with the first storage gate electrode 32 and the second storage gate electrode 52 on both sides thereof.

The second control section 6 is formed between the charge storage section 5 and the charge transfer section 8. The second control section 6 passes the signal charge stored in the second storage section 5 to the charge transfer section 8. The second control section 6 is selectively formed on the surface part of the second region 12, and has a second impurity layer 61 which: is the same conductive type as the first region 11 and the second region 12; and is lower in density than the first region 11 and the second region 12. A thin N-layer can be formed on the surface of the silicon substrate 10 as the second impurity layer 61, by implanting boron so as to reach, for example, $9.0 \times 1011/cm^2$ at 50 KeV, similarly to the first impurity layer 41.

Moreover, a second control gate electrode 63 is formed above the second impurity layer 61 with a second control gate insulation film 62 interposed therebetween. A predetermined clock pulse is applied to the second control gate electrode 63. Accordingly, the passing of the charge from the storage section 5 to the transfer section 8 is controlled. A part of the second control gate electrode 63 overlaps with the second storage control gate electrode 52 and the gate electrode 82 of a CCD register on both sides thereof.

The N-type region 12 is higher in impurity density than the N-type region 11. In other words, the N layer of the storage section 5 is higher in impurity density than the N layer of the storage section 3. Therefore, the storage section 5 on the charge transfer section 8 side is higher in potential than the storage section 3. As a result, it is possible to smoothly flow the signal charge from the storage section 3 to the charge transfer section 8 through the storage section 5.

Figure 5:
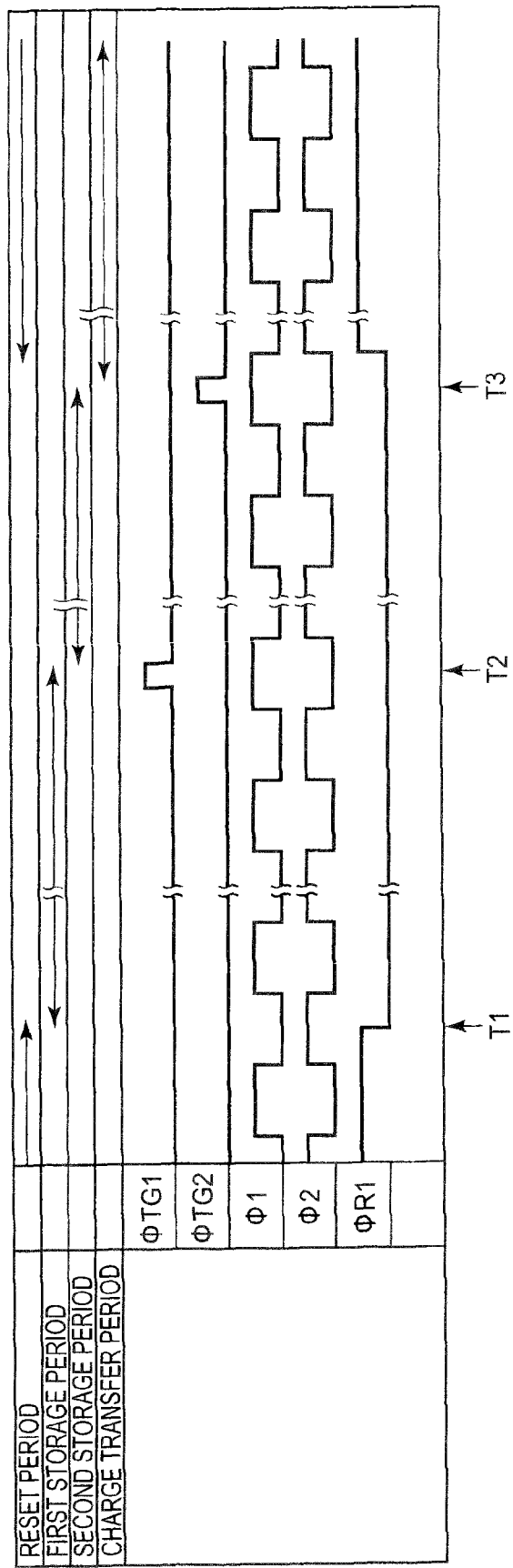
FIG. 5 is an example of timing for operating the CCD image sensor of the first embodiment.

Note that a difference in impurity density between the first region 11 and the second region 12 can be made by double implantation. For example, it is possible to firstly implant N (phosphorus) in the first region 11 and the second region 12 on condition of $1.4 \times 1012/cm^2$ at 80 KeV, and secondly implant N (phosphorus) in the second region 12 on condition of $4 \times 1011/cm^2$ at 80 KeV. Alternatively, as shown in FIG. 5, it is possible to firstly implant P (boron) in the first region 11 and the second region 12 on condition of $4 \times 1011/cm^2$ at 50 KeV, and secondly implant N (phosphorus) in the first region 11 on condition of $4 \times 1011/cm^2$ at 80 KeV.

FIG. 2B shows a potential profile on the surface of the substrate when applying a 0 V (GND) potential to the silicon substrate 10 and the channel stop region 13 of the CCD image sensor 1 as shown in FIG. 2A, a clock pulse oTG1 to the first control gate electrode 43, a clock pulse oTG2 to the second control gate electrode 63, and a clock pulse o1 to the gate electrode 82, respectively. In FIG. 2B, solid lines indicate that the clock pulses oTG1, oTG2, and o1 are at the "L" level, respectively, and broken lines indicate that the clock pulses are at the "H" level. Furthermore, in FIG. 2B, oPD indicates the depth of a potential well of the photodiode section 2, oST1 indicates the depth of a potential well of the first storage section 3, and oST2 indicates the depth of a potential well of the second storage section 5.

In the CCD image sensor 1 according to this embodiment, the signal charge generated by light incident on the photodiode section 2 is stored in the potential well of the auxiliary charge storage section 3. The stored signal charge then moves to the first control section 4, by opening the first control gate 4 (oTG1 becomes "H"). The signal charge which has theretofore been stored in the first control section 4 is then stored in the potential well of the charge storage section 28, by closing the first control gate 4 (oTG1 becomes "L"). The stored signal charge is then transferred to under the gate electrode 82 of the charge transfer section 8, by opening the second control gate 6 (oTG2 becomes "H"). In this manner, the second control section 6 on the charge transfer section 8 side is higher in potential than the first control section 4, and the first control section 4 is formed lying astride the first region 11 and the second region 12. Hence, it is possible to smoothly flow the signal charge from the photodiode section 2 to the charge transfer section 8 through the auxiliary charge storage section 3, the first control section 4, the charge storage section 5, and the second control section 6.

As shown in FIG. 3A which shows a cross-sectional view taken along the line Y-Y' of FIG. 1, the reset section 7 is formed to be adjacent to the charge storage section 5. The reset section 7 discharges an unnecessary signal charge from the second control section 6. The reset section 7 has a third impurity layer 71 which: is selectively formed on the surface part of the second region 12; is the same N-type as the first region 11 and the second region 12; and is lower in density than the first region 11 and the second region 12. A thin N-layer can be formed on the surface of the silicon substrate 10 as the third impurity layer 71, by implanting boron so as to reach, for example, $9.0 \times 1011/cm^2$ at 50 KeV, similarly to the first impurity layer 41 and the second impurity layer 61. Moreover, a first reset gate electrode 73 is formed above the third impurity layer 71 with a gate insulation film 72 interposed therebetween. A predetermined clock pulse is applied to the first rest gate electrode 73. Apart of the first reset gate electrode 73 overlaps with the second storage gate electrode 52. Furthermore, a reset drain 74 composed of the N+ region is provided on the silicon substrate 10. An unnecessary charge remaining in the second control section 6 is discharged to the reset drain 74 via the first reset gate electrode 73.

FIG. 3B shows a potential of each part of the surface of the substrate when applying: a 0 V (GND) potential to the silicon substrate 10 as well as to the channel stop region 13 of the CCD image sensor 1 as shown in FIG. 3A; a clock pulse oTG1 to the first control gate electrode 43; and a clock pulse oR1 to the first reset gate electrode 73, respectively. In FIG. 3B, solid lines indicate that the clock pulses oTG1, and oR1 are at the "L" level, respectively, whereas broken lines indicate that the clock pulses are at the "H" level.

In the CCD image sensor according to this embodiment, the unnecessary charge remaining in the second storage section 5 is discharged from the second control section 6 to the reset drain 74 through the first reset gate electrode 73. In other words, it is possible to perform a reset operation of the second storage section 5 in a state where the second control gate electrode 63 and the photo diode section 2 are separated by setting oTG1 applied to the first control gate electrode 43, and oTG2 applied to the second control gate electrode 63, to the "L" level, as well as by setting oR1 to the "H" level. Therefore, it is possible to completely reset the unnecessary charge.

As shown in FIGS. 4A and 4B, the charge transfer section 8 of FIG. 1 is a CCD with a two-phase drive which is conventionally well-known, and the signal charge transferred through the second control section 6 is sequentially transferred and is then outputted through the output amplifier 9.

Here, with reference to FIG. 5, descriptions will be given of the operation of the CCD image sensor 1 according to the first embodiment. FIG. 5 is a view showing an example of the timing of each signal applied to the CCD image sensor according to this embodiment, and has a reset period for discharging the unnecessary charge stored in the charge storage section 5, a first storage period for storing the signal charge in the auxiliary storage section 3, a second storage period for storing the signal charge in the charge storage section 5, and a charge transfer period for transferring the signal charge in the charge transfer section 8.

In the reset period, oR1 is at the "H" level, and oTG1 and oTG2 are at the "L" level. During this period, the unnecessary charge stored in the storage section 5 is completely discharged to the reset drain 74. In the first storage period, oR1 then reaches the "L" level, and the signal charge is transferred from the photodiode section 2 to the storage section 3 (T1). In the second storage period, the signal charge stored in the storage section 3 is transferred to the storage section 5 (T2) by oTG1 reaching the "H" level. Thereafter, by setting øTG1 to the "L" level, the signal charge is held in the storage section 5 until the reading in all image areas has been completed. In the charge transfer period, the second signal charge held in the storage section 5 is transferred to the charge transfer section 8 (T3) by setting oTG2 to the "H" level, at the point when the reading in all the image areas has been completed. The transferred signal charge is sequentially taken out from the charge transfer section 8 through the output amplifier 9.

In this manner, according to the present invention, not only the photodiode section but also the auxiliary storage section, the first control section, the charge storage section, the second control section, and the charge transfer section are formed into the same conductive type semiconductor region. Hence, the movement of the charge is smoothly performed. Additionally, dark current can be prevented from being generated because the surface of the semiconductor substrate becomes the P-type in the PIN-ing state during operation. An afterimage can be prevented from being generated because it is possible to completely discharge an unnecessary charge of the second storage section to the reset drain.

Figures 6A, 6B:
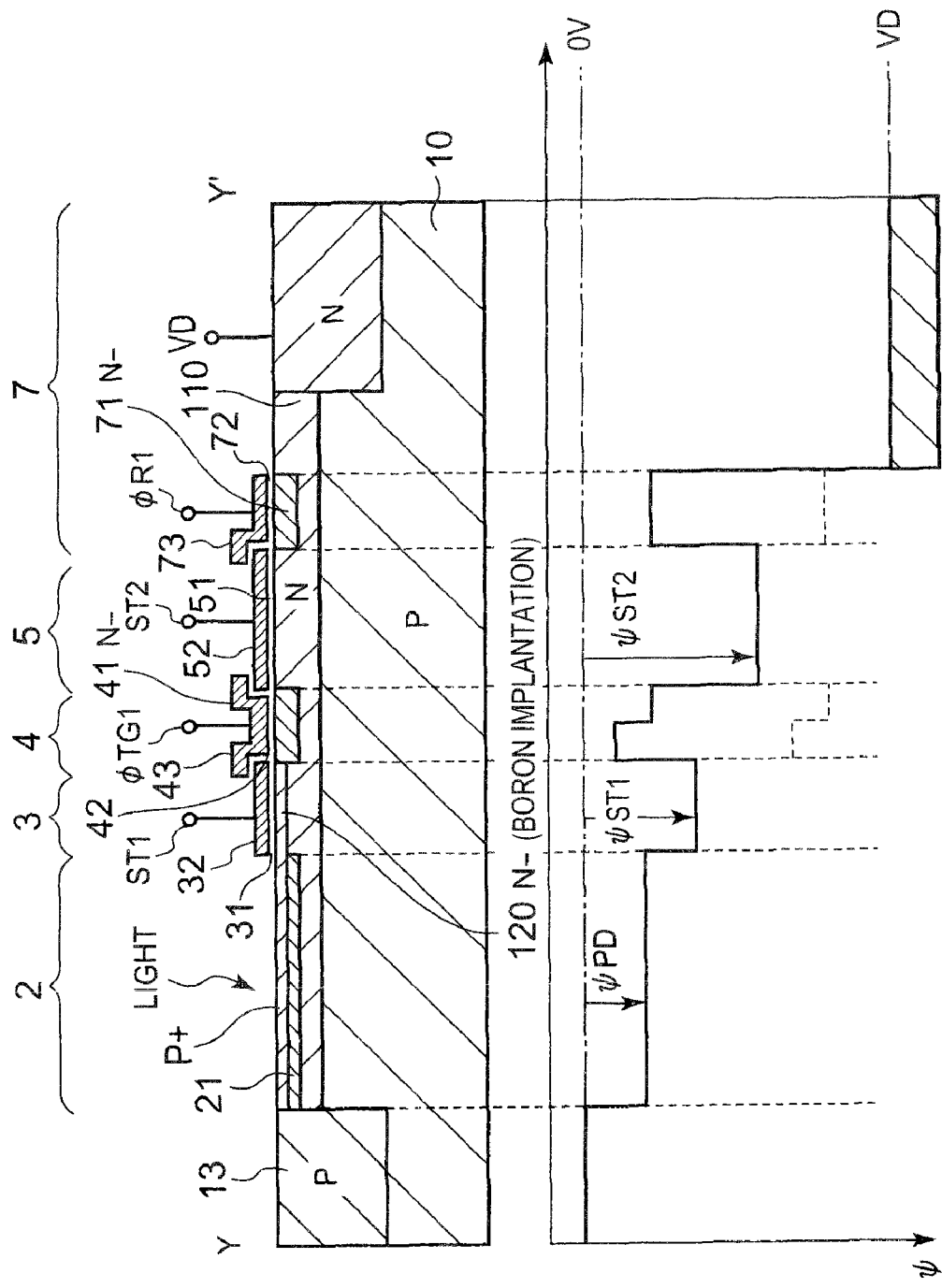
FIGS. 6A and 6B are cross-sectional views showing a CCD image sensor according to a second embodiment of the present invention.

Descriptions will be given of a second embodiment of the present invention with reference to FIGS. 6A and 6B. Note that FIG. 6 corresponds to the configuration from the photodiode section 2 to the reset section 7 in FIG. 3. In this embodiment, the photodiode section 2, the auxiliary storage section 3, the first control gate section 4, the signal charge storage section 5, the second control gate section 6, the charge transfer section 8, the reset section 7, and the like are formed to be a single-layer while having a semiconductor region 110 as a base substrate. Moreover, since the single-layer semiconductor region 110 is adopted, in such a state, a predetermined potential difference is not generated in the first control gate section 4, and in the charge storage sections 3 and 5. Therefore, the surface of an area 120 corresponding to a part of the photodiode section 2, the auxiliary storage section 3, and the control gate section 4 in the semiconductor region 110 is lower in impurity density than the other areas. This is achieved by selectively ion-implanting a P-type impurity such as boron into the area 120.

In other words, after a P+ region 21 of the channel stop region 13, the semiconductor region 110, and the photodiode section 2 is formed, a P-type impurity in the area 120 is selectively ion-implanted. Afterwards, the gate electrodes 32 and 52 and an electrode of a CCD section in the first layer, the electrodes being made of polysilicon, for example, are formed as a first gate electrode layer. A P-type impurity such as boron is ion-implanted again by masking undesired areas to form the impurity layers 41 and 71.

In this embodiment, too, it is easily understood that the same operations and effects as the previous embodiment can be obtained so that detailed descriptions thereof will be omitted.

Figure 7:
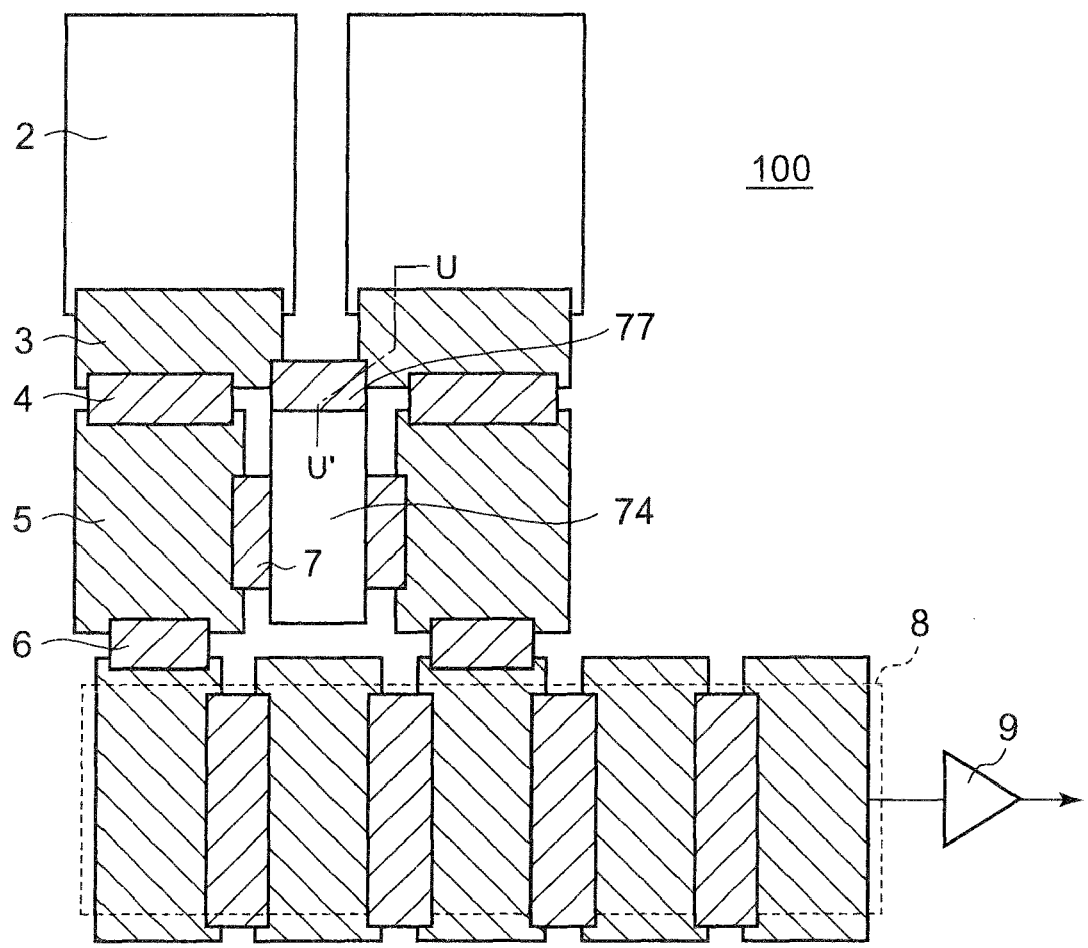
FIG. 7 is a plan view showing a CCD image sensor according to a third embodiment of the present invention.
Figures 8A, 8B:
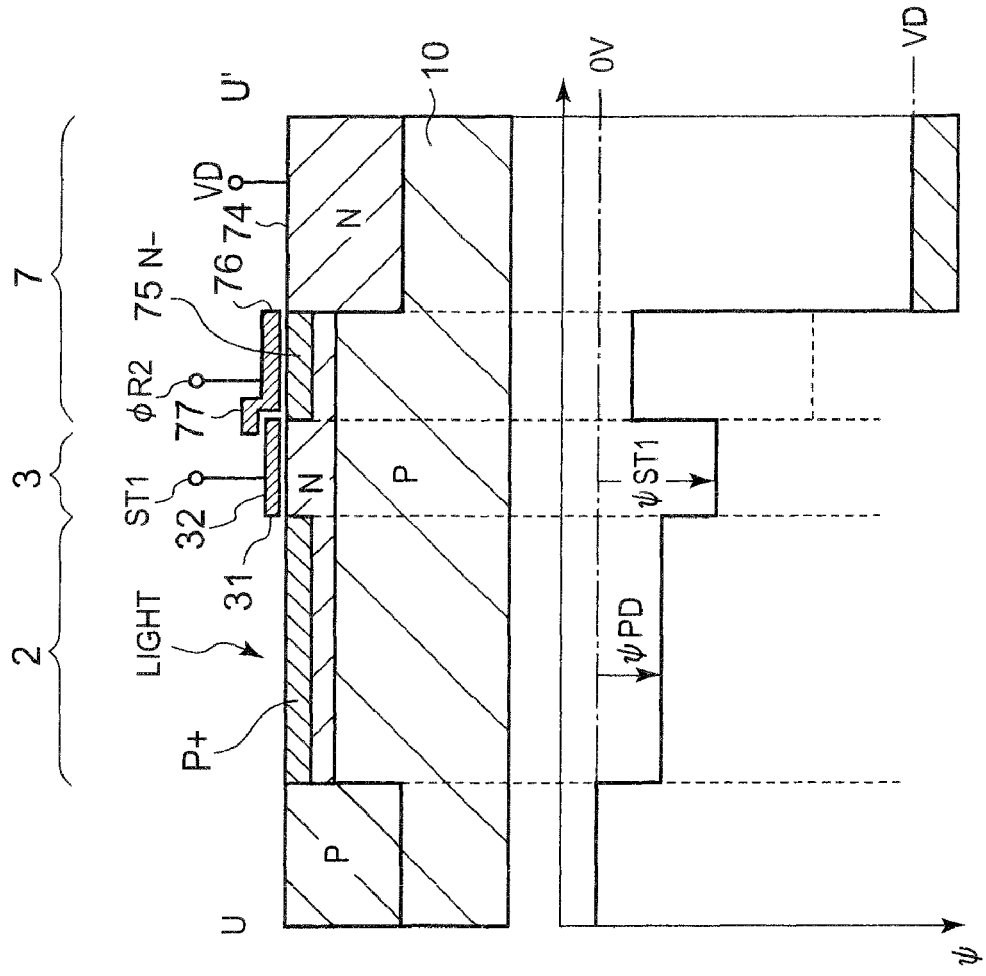
FIG. 8A is a cross-sectional view taken along the line U-U' of FIG. 7.
FIG. 8B is a potential view during operation.

Next, descriptions will be given of a CCD image sensor according to a third embodiment of the present invention with reference to FIGS. 7, 8A, and 8B. FIG. 7 is a plan view showing a configuration of a CCD image sensor 100 according to this embodiment. FIG. 8A is a cross-sectional view taken along the line U-U' of FIG. 7, and FIG. 8B is a view showing a potential of each part. In this embodiment, a point different from the first embodiment is the configuration of the reset section 7. Consequently, descriptions will be omitted of the other configurations.

As shown in FIGS. 7 and 8A, the reset section 7 according to this embodiment has a function for discharging an unnecessary charge from the auxiliary storage section 3, in addition to the function for discharging an unnecessary charge from the charge storage section 5. The reset section 7 is selectively formed on the surface part of the first region 11, is the same N-type as the first region 11, and has a fourth impurity layer 75 with a lower density than the first region 11. A thin N-layer can be formed on the surface of the silicon substrate 10 as the fourth impurity layer 75 by implanting boron so as to reach, for example, $9.0\times1011/cm^2$ at 50 KeV, similarly to the third impurity layer 71. Additionally, a second reset gate electrode 77 is formed above the fourth impurity layer 75 with a gate insulation film 76 interposed therebetween. A predetermined clock pulse is applied to the second reset gate electrode 77. A part of the second reset gate electrode 77 overlaps with the storage gate electrode 32. Moreover, the reset drain 74 made of the N+ region is provided on the silicon substrate 10. The reset drain 74 is shared between the first reset gate electrode 73 and the second reset gate electrode 77. It is possible to discharge a signal charge from the storage section 3 to the reset drain 74 via the second reset gate electrode 77.

FIG. 8B shows a potential of each part of the surface of the substrate when a 0V (GND) potential is applied to the silicon substrate 10 as well as to the channel stop region 13 of the CCD image sensor 1 as shown in FIG. 8A, and when a clock pulse oR2 is applied to the second control gate electrode 77. In FIG. 8B, solid lines indicate that the clock pulse oR2 is at the "L" level, respectively, and broken lines indicate that the clock pulse is at the "H" level.

In the CCD image sensor according to this embodiment, signal charges generated by light incident on the photodiode section 2 are stored in the potential well of the auxiliary storage section 3. Under an environment where the amount of light is large, a state where the photodiode section 2 overflows with signal charges may exert an influence on the signal charge stored in the storage section 3. At this point, the overflowed signal charges can be discharged to the reset drain 74 in a state of being separated from the second control section 6, by setting øTG2 applied to the second control gate electrode 63 to the "L" level and setting øR2 to the "H" level. Accordingly, it is possible to obtain excellent image information without saturation.

Figure 9:
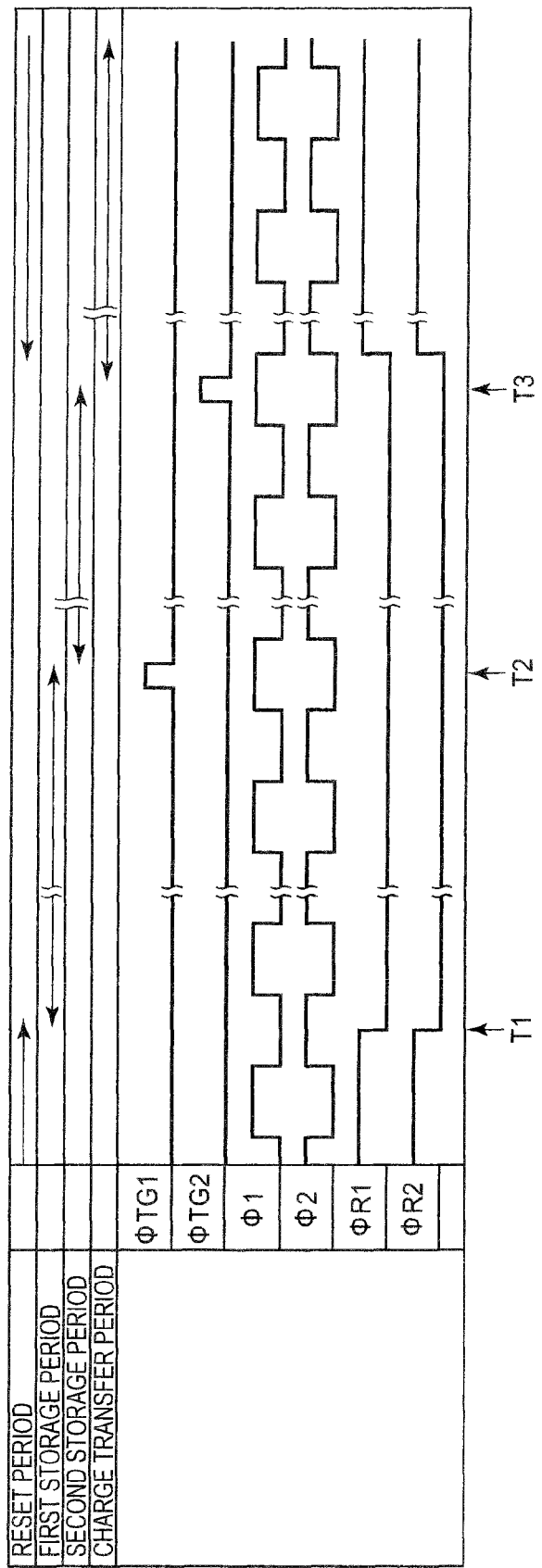
FIG. 9 is an example of timing for operating the CCD image sensor of the third embodiment.

Descriptions will be given of the operation of the CCD image sensor according to the third embodiment with reference FIG. 9. As shown in FIG. 9, there are a reset period, a first storage period, a second storage period, and a charge transfer period. In the reset period, oR1 and oR2 are at the "H" level, and oTG1 and oTG2 are at the "L" level. During this period, unnecessary charges of the storage sections 3 and 5 are completely discharged to the reset drain 74. In the first storage period, oR1 and oR2 are at the "L" level, and a signal charge is transferred from the photodiode section 2 and the storage section 3 (T1). In the second storage period, the signal charge stored in the first storage section 3 is transferred to the second storage section 5 (T2) by oTG1 reaching the "H" level. Afterwards, by setting øTG1 to the "L" level, the signal charge is held in the storage section 5 until all image areas have been read. In the charge transfer period, at the point when the reading in all the image areas has been completed, oTG2 is set to the "H" level, and the second signal charge held in the storage section 5 is transferred to the charge transfer section 8 (T3). The transferred signal charge in the charge transfer section 8 is taken out through the sequential output amplifier 9.

Figure 10:
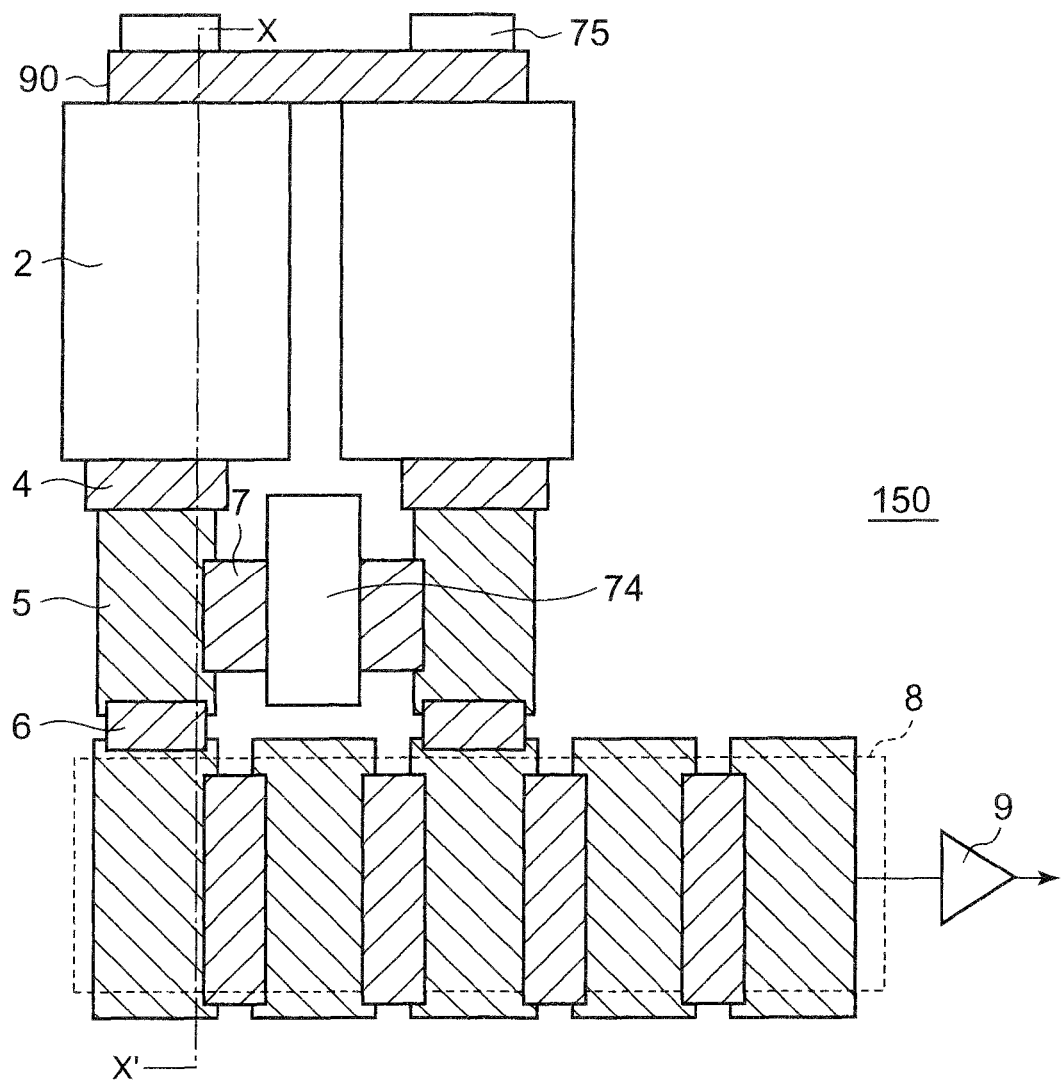
FIG. 10 is a plan view showing a CCD image sensor according to a fourth embodiment of the present invention.
Figure 11:
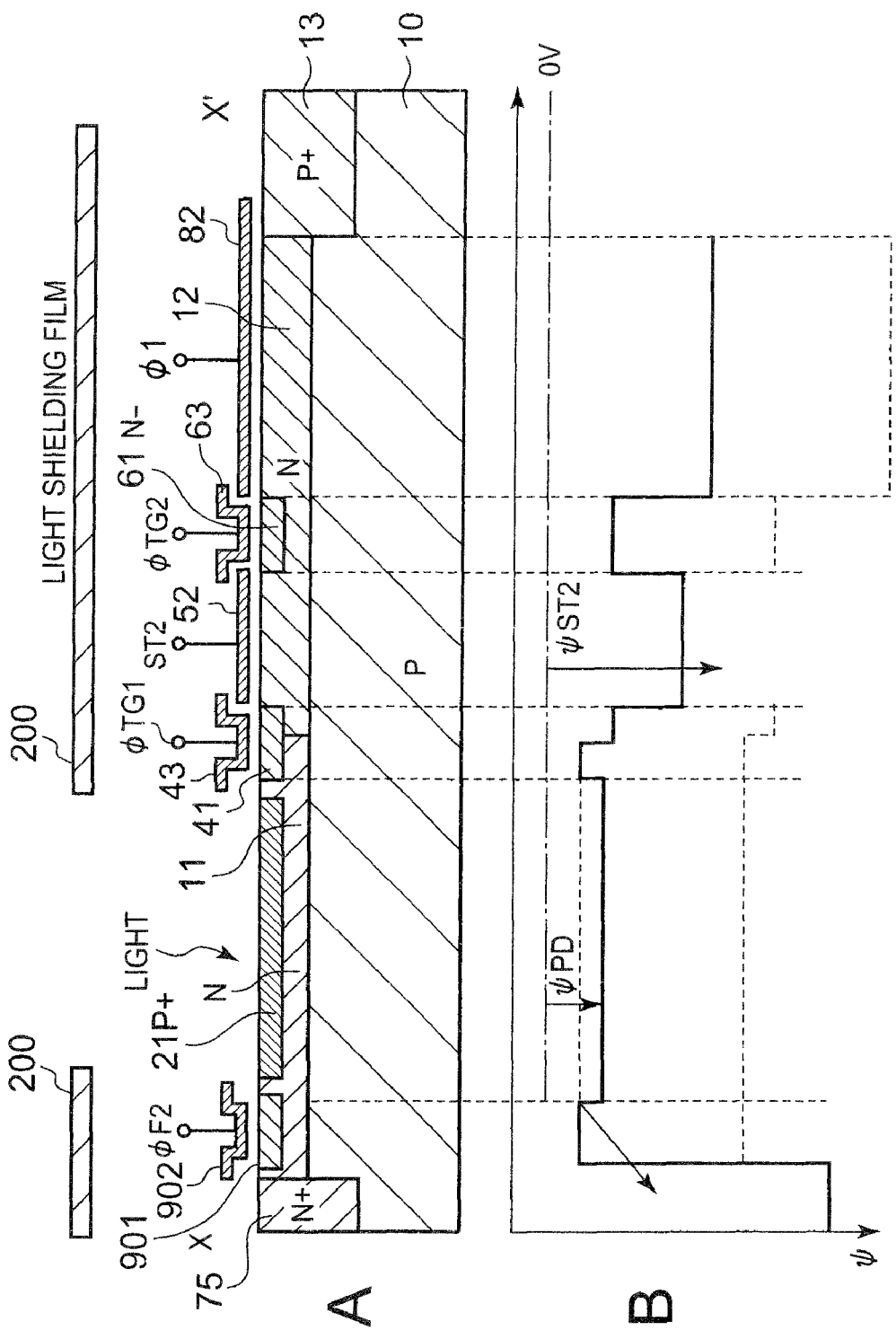
FIG. 11A is a cross-sectional view taken along the line X-X' of FIG. 10.
FIG. 11B is a potential view during operation.

Descriptions will be given of a CCD image sensor according to a fourth embodiment of the present invention with reference to FIGS. 10, 11A and 11B. Note that FIG. 11A is a cross-sectional view taken along the line X-X' of FIG. 10, and FIG. 11B is a potential of each part of FIG. 11A. The feature of this embodiment is that a signal charge in the photodiode section 2 is supplied and stored in the charge storage section 5 under the control of the control gate 4, without going through the auxiliary storage section 3 of FIG. 1 and the like. Furthermore, a reset drain 90 is provided opposite to a side where a control gate electrode of the photodiode as the photodiode section 2 is provided. The reset drain 90 has an N-region 901 (formed simultaneously with the regions 41 and 61) and a reset gate electrode 902 thereon. Additionally, an N+-type drain region is formed adjacently to the region 11 and opposite to the control gate 4. A charge of the photodiode is reset by applying the reset pulse oR2 to the electrode 902. Note that although light shielding films 200 are shown in FIG. 11A, the light shielding films 200 are similarly provided in the first to third embodiments, too.

Figure 12:
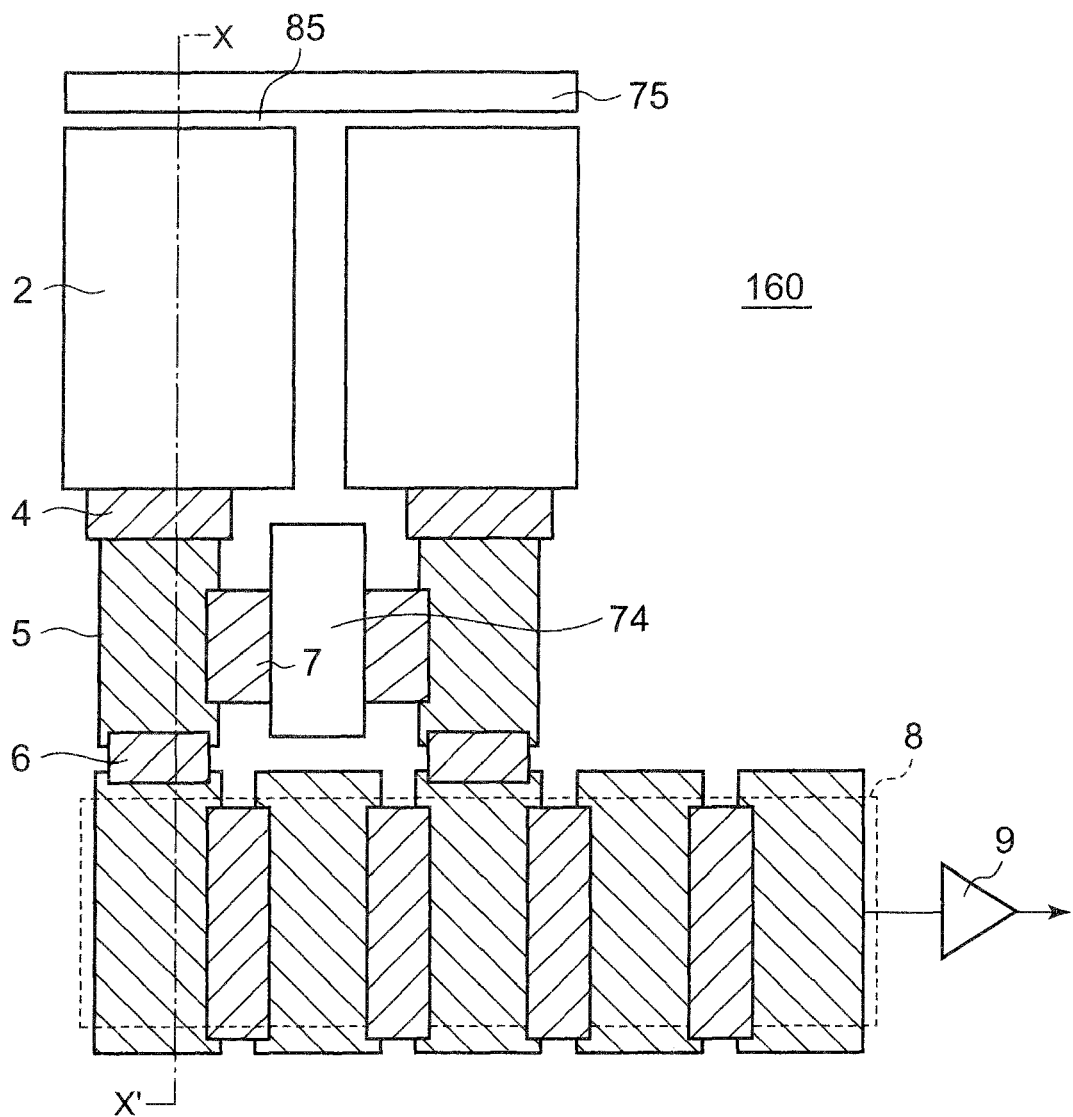
FIG. 12 is a plan view showing a CCD image sensor according to a fifth embodiment of the present invention.
Figures 13A, 13B:
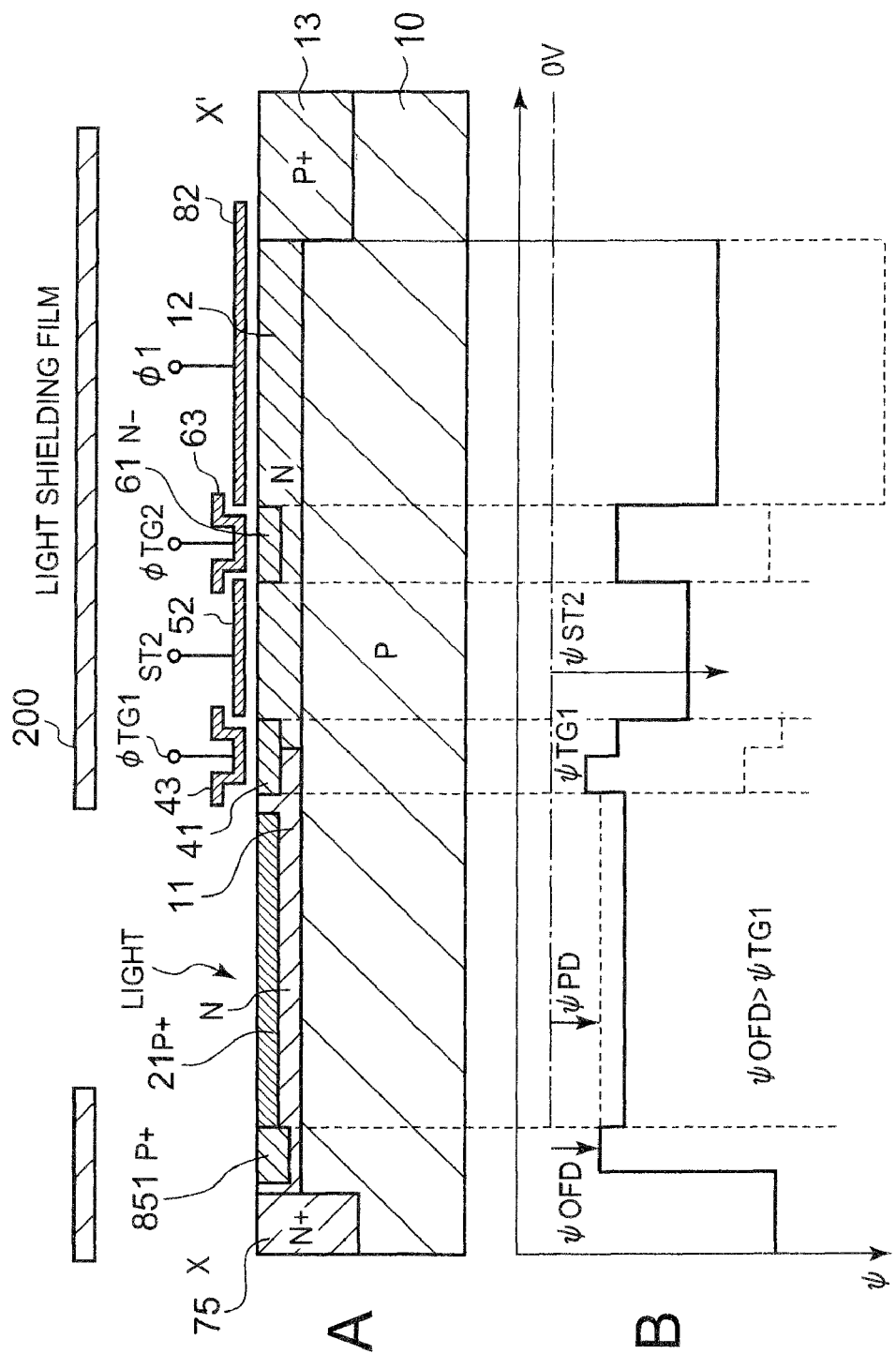
FIG. 13A is a cross-sectional view taken along the X-X' line of FIG. 12.
FIG. 13B is a potential view during operation.

FIGS. 12, 13A and 13B show a CCD image sensor according to a fifth embodiment of the present invention. In this embodiment, a shatter structure 85 is provided instead of the reset drain of FIG. 11 to prevent undesired charges from flowing to the charge storage section 5 side. As shown in FIG. 13A, the shatter structure 85 is configured: to be in contact with the N+ drain region 75 (this region is formed to be continuous between each photodiode) and the P+ region 2 of the photodiode; and to have a deep P+ region 851.

Figure 14:
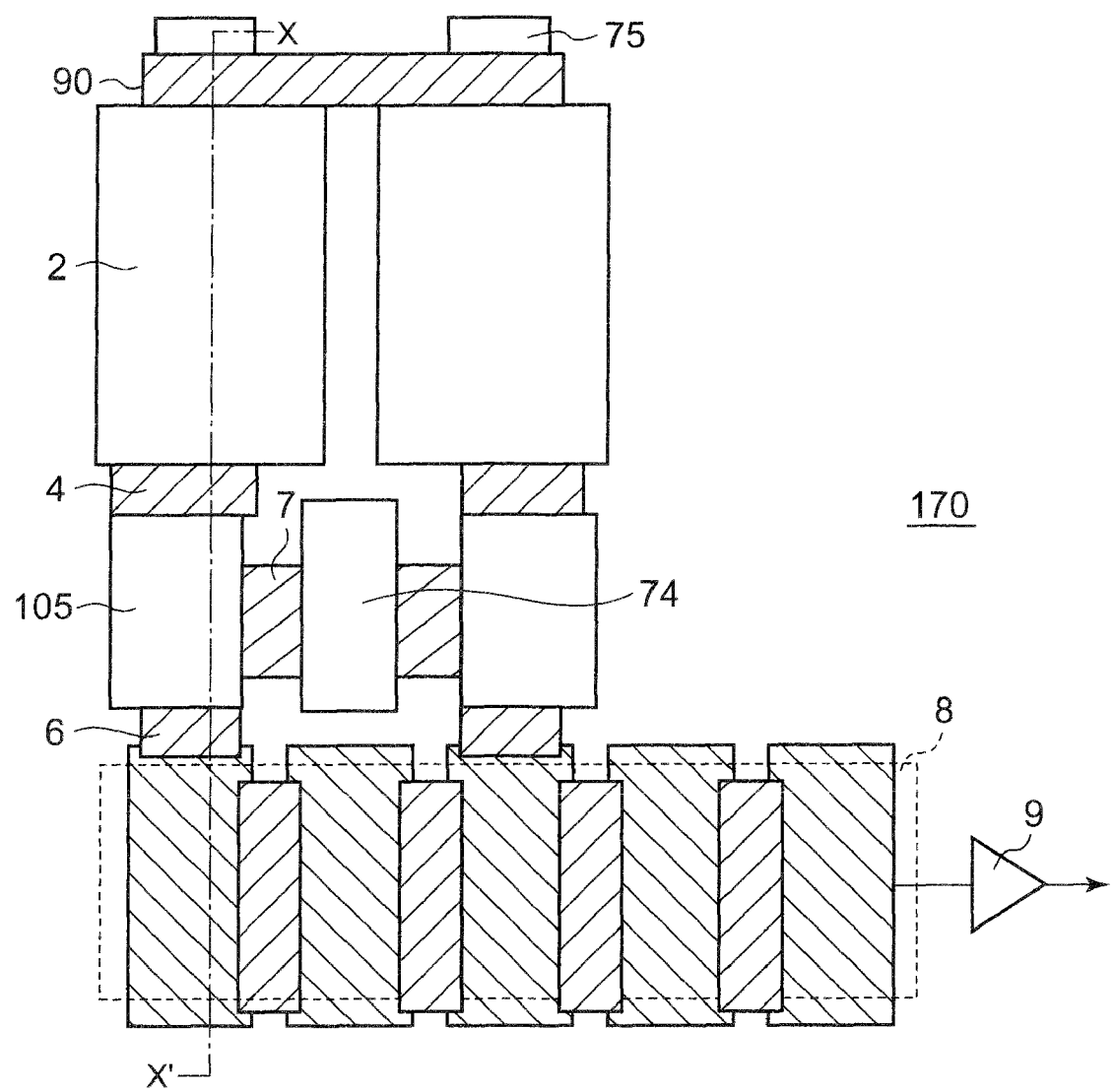
FIG. 14 is a plan view showing a CCD image sensor according to a sixth embodiment of the present invention.
Figures 15A, 15B:
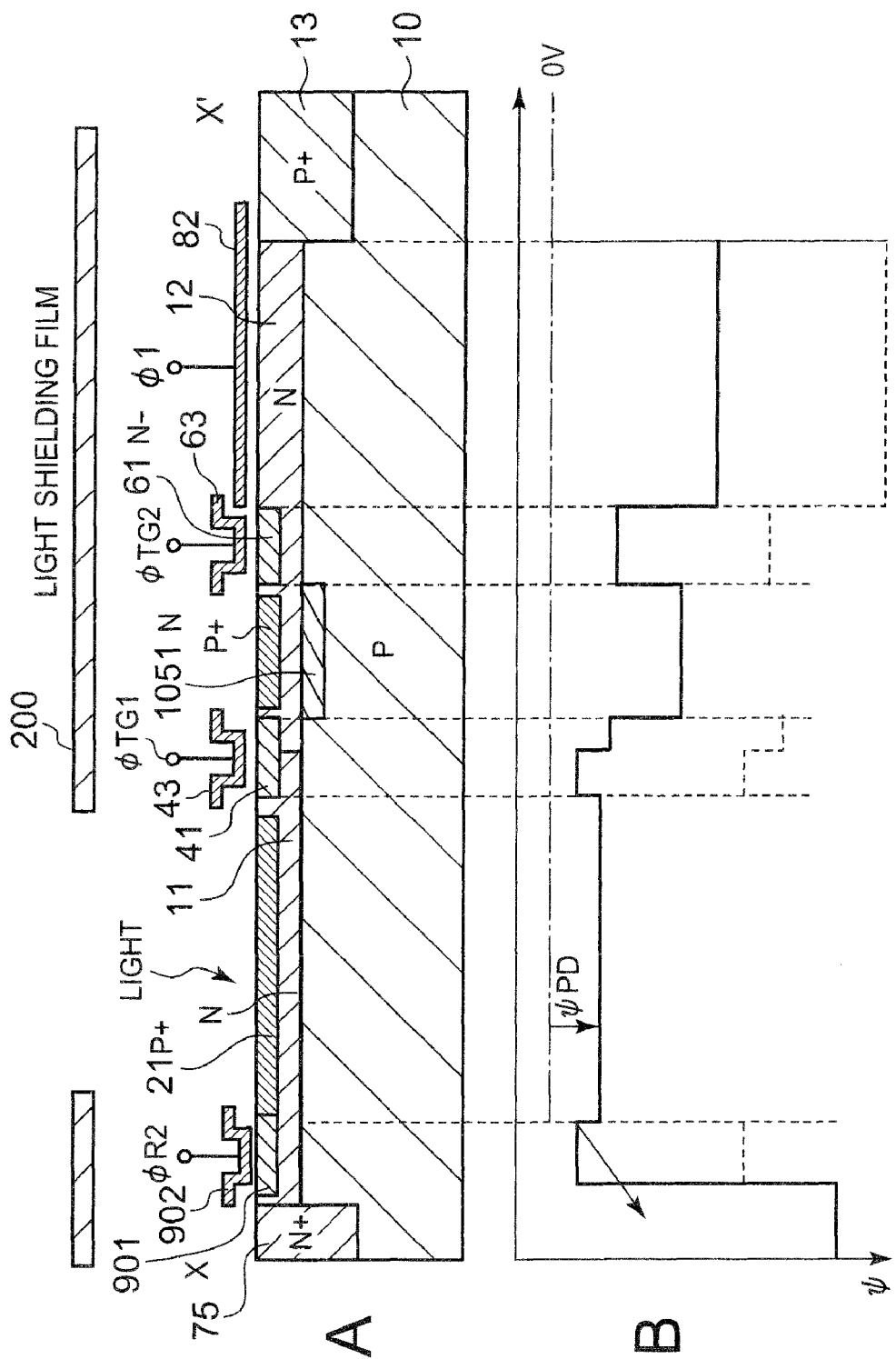
FIG. 15A is a cross-sectional view taken along the line X-X' of FIG. 14.
FIG. 15B is a potential view during operation.
Figure 17:
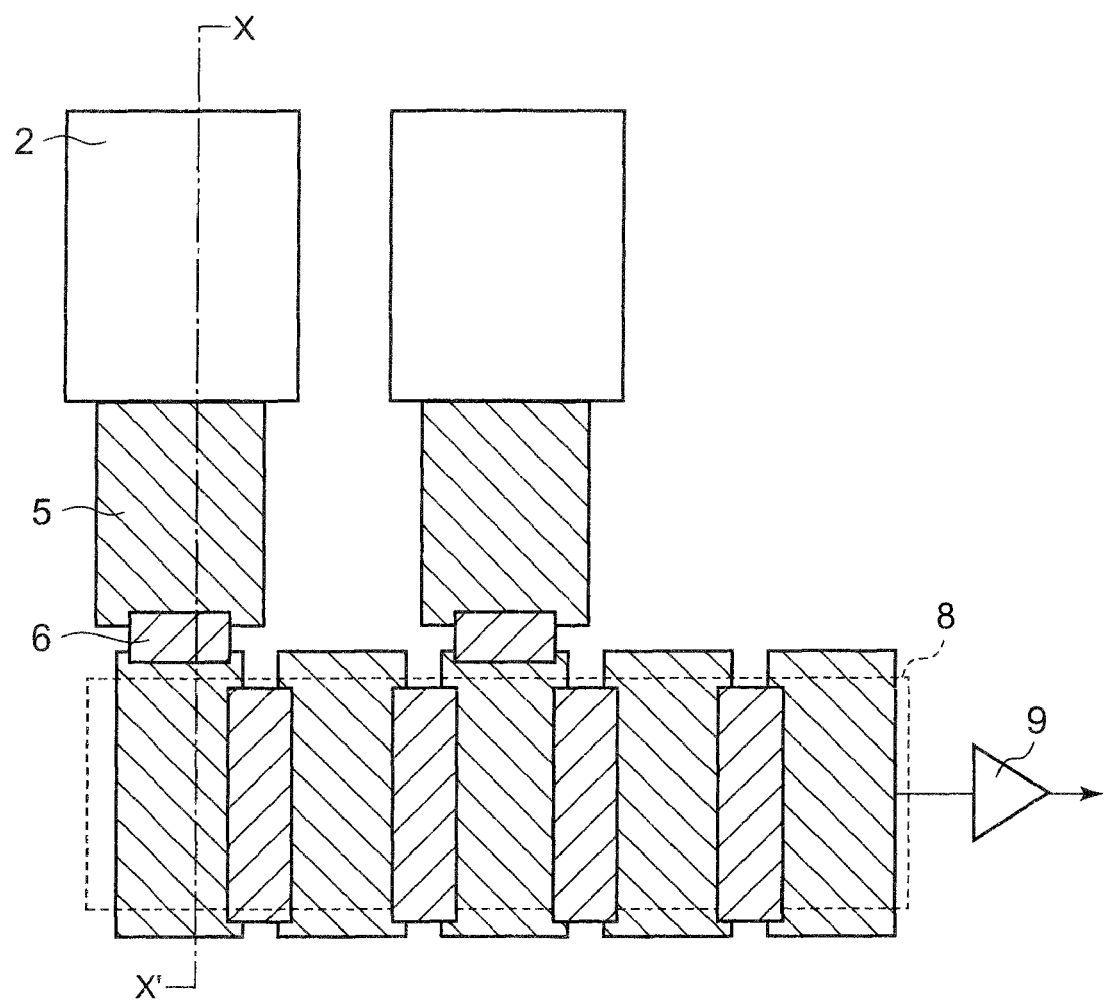
FIG. 17 is a plan view showing another conventional image sensor.
Figures 18A, 18B:
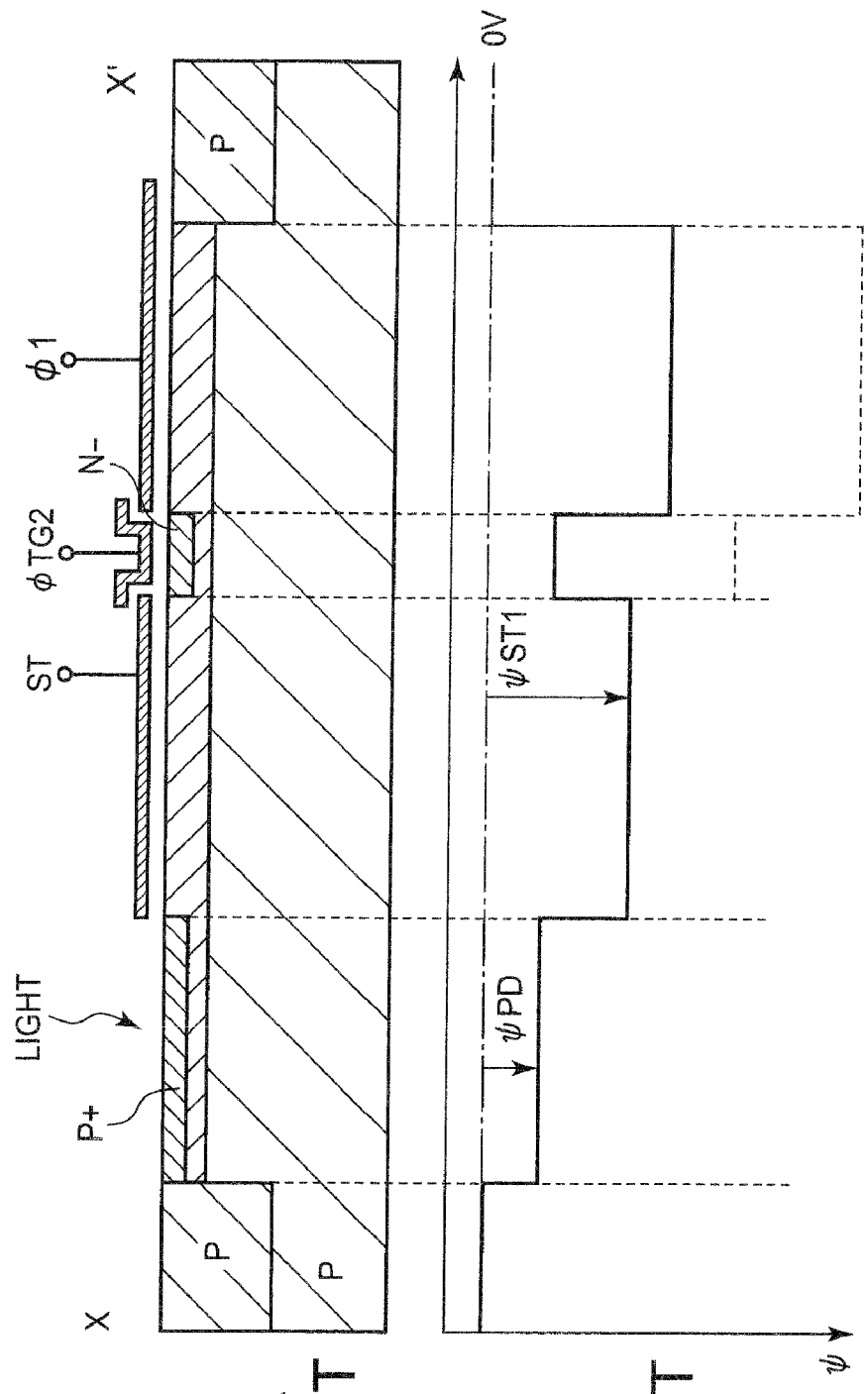
FIG. 18A is a cross-sectional view taken along the line X-X' of FIG. 17.
FIG. 18B is a potential view during operation.
Figure 19:
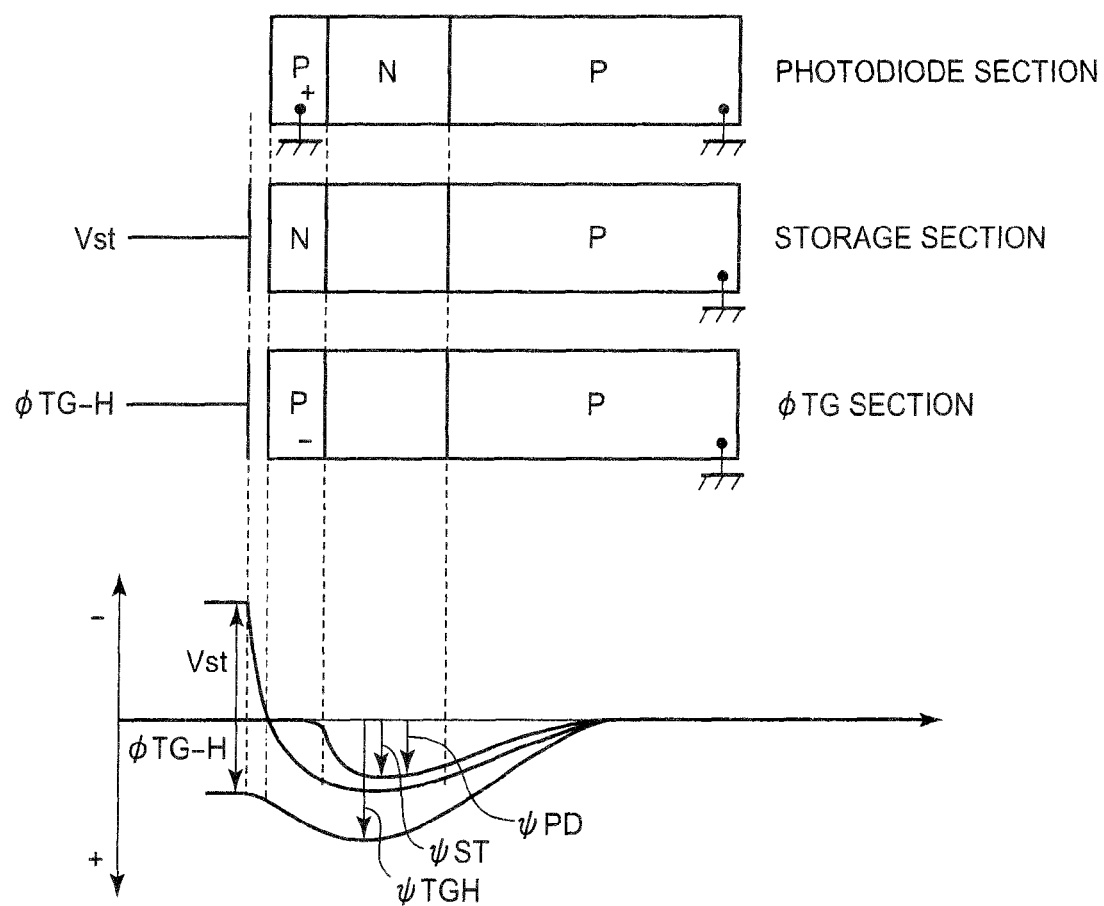
FIG. 19 is a view showing a potential profile in the depth direction of the substrate of the conventional CCD image sensor.

FIGS. 14, 15A, and 15B show a CCD image sensor according to a sixth embodiment of the present invention. In this embodiment, unlike the previous embodiments, a charge storage region is composed of the P- and N-type regions similarly to the photodiode 2. In other words, as shown in FIG. 15A, a P+-type region 1052 is formed on the surface part of the N-type region 12 corresponding to the charge storage section 5. Moreover, an N-type region 1051 is added to this part in order to obtain a desired potential. Accordingly, the part is deeper than the regions 11 and 12 as a whole. The PIN-ing gate type in this embodiment is not a PIN-ing gate type in which the surface is reversed to the P-type by applying a negative voltage to a storage electrode as in the previous embodiments. Therefore, a storage control electrode which covers the P+ region 1052 is unnecessary.

Note that since each operation of the fourth to sixth embodiments is easily understood from each of the first to third embodiments, descriptions thereof will be omitted.

As described above, according to the present invention, not only the photodiode section but also each storage section, each control section, and the charge transfer section are formed in the same conductive region. Thus, it is possible to smoothly move charges and to prevent an afterimage from being generated. In addition, the surface of the silicon substrate enters a state of the P-type in the storage sections during operation, due to the PIN-ing control or the device structure itself. Thus, dark current can be prevented from being generated. Moreover, it is possible to control a storage time with the first and second control electrodes, obtain the sufficient amount of signals even under an environment of a small light amount, and obtain image information without saturation by shortening a storage time under an environment of a large light amount.

An object of the present invention is to achieve a structure which can control a storage time in which dark current is reduced. It is possible to use another method apart from the above examples for parts except for a part related to the photodiode section, the storage sections, the reset section, the charge transfer section, and the control of each part. For example, in the above embodiments, the descriptions were given of the examples using the charge transfer section with a two-phase drive. However, another method such as a four-phase drive can also be used as the method for driving the charge transfer section. Furthermore, the example of a double-layer polysilicon gate structure is illustrated in the above embodiments, but the present invention can be achieved with another structure such as a single-layer structure and a three-layer structure. Moreover, assume that the configuration is in the PIN-ing state where the surface of the substrate is the P-type during operation, and that the storage section has two stages which are provided with control gate electrodes at their respective exits. In this case, it is possible to select the presence or absence of the reset section. Additionally, it is also possible to configure a CCD image sensor in which the feature of each embodiment is appropriately mixed. Although the invention has been described above in connection with several preferred embodiments thereof, it will be appreciated by those skilled in the art that those embodiments are provided solely for illustrating the invention, and should not be relied upon to construe the appended claims in a limiting sense.

What is claimed is:

1. An image sensor, comprising:
   a photodiode section;
   a charge storage section;
   a charge transfer section;
   a first control gate section between the photodiode section and the charge storage section to control movement of a signal charge from the photodiode section to the charge storage section;
   a second control gate section provided between the charge storage section and the charge transfer section to control movement of the signal charge from the charge storage section to the charge transfer section, the charge storage section storing the signal charge and including a region of a first conductivity type and a storage gate electrode that covers the region with an insulation film therebetween, a predetermined negative DC bias voltage being applied to the storage gate electrode so that the charge storage section is configured to be in a PIN-ing state, and the photodiode section, the charge storage section, the charge transfer section, the first control gate section and the second control gate section are provided in a semiconductor region of a first conductivity type formed in a semiconductor body of a second conductivity type; and an additional charge storage section provided between the photodiode section and the first control gate section, the additional charge storage section has a gate electrode to which a DC voltage is applied, the gate electrode being provided over a portion of the semiconductor region in which the additional charge storage section is formed with an intervention of a gate insulation film therebetween.

2. An image sensor, comprising:

a photodiode section;

a charge storage section;

a charge transfer section;

a first control gate section between the photodiode section and the charge storage section to control movement of a signal charge from the photodiode section to the charge storage section;

a second control gate section provided between the charge storage section and the charge transfer section to control movement of the signal charge from the charge storage section to the charge transfer section, the charge storage section storing the signal charge and including a region of a first conductivity type and a storage gate electrode that covers the region with an insulation film therebetween, a predetermined negative DC bias voltage being applied to the storage gate electrode so that the charge storage section is configured to be in a PIN-ing state, and the photodiode section, the charge storage section, the charge transfer section, the first control gate section and the second control gate section are provided in a semiconductor region of a first conductivity type formed in a semiconductor body of a second conductivity type; and an additional charge storage section provided in a portion of the semiconductor region between the photodiode section and the first control gate section, the portion of the semiconductor region having a surface part that is lower in impurity concentration than a portion of the semiconductor region in which the charge storage section is formed.

3. The sensor according to claim 1, further comprising a reset section formed adjacently to the charge storage section to discharge the signal charge from the charge storage section and from the additional charge storage section.

4. The CCD image sensor according to claim 3, further comprising a reset gate resetting the signal charge of the photodiode section.

5. The CCD image sensor according to claim 3, further comprising an overflow drain for the photodiode section.

6. An image sensor, comprising:

a photodiode section;

a charge storage section;

a charge transfer section;

a first control gate section between the photodiode section and the charge storage section to control movement of a signal charge from the photodiode section to the charge storage section; and a second control gate section provided between the charge storage section and the charge transfer section to control movement of the signal charge from the charge storage section to the charge transfer section, the charge storage section storing the signal charge in a PIN-ing state, and the photodiode section, the charge storage section, the charge transfer section, the first control gate section and the second control gate section being provided in a semiconductor region of a first conductivity type formed in a semiconductor body of a second conductivity type, the semiconductor region including a first region in which the photodiode section is formed, and a second region in which the charge storage section and the second control gate section are formed, the second region being higher in impurity concentration than the first region, and the first control gate section being formed astride the first and second regions, and each of the first and second control gate sections including a third region of the first conductivity type that is lower in impurity concentration than the first and second regions and a gate electrode covering the third region with an intervention of an insulation film therebetween.

* * * * *